US008816265B2

(12) United States Patent
Goto

(10) Patent No.: US 8,816,265 B2
(45) Date of Patent: Aug. 26, 2014

(54) SOLID-STATE IMAGE PICKUP DEVICE AND IMAGE PICKUP APPARATUS

(75) Inventor: Takashi Goto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 143 days.

(21) Appl. No.: 13/637,435

(22) PCT Filed: Mar. 29, 2011

(86) PCT No.: PCT/JP2011/057900
§ 371 (c)(1),
(2), (4) Date: Sep. 26, 2012

(87) PCT Pub. No.: WO2011/125677
PCT Pub. Date: Oct. 13, 2011

(65) Prior Publication Data
US 2013/0015328 A1    Jan. 17, 2013

(30) Foreign Application Priority Data

Mar. 31, 2010 (JP) ................................. 2010-084408
Oct. 29, 2010 (JP) ................................. 2010-244819

(51) Int. Cl.
*H01L 27/00* (2006.01)
*H04N 9/64* (2006.01)

(52) U.S. Cl.
USPC ........................................ 250/208.1; 348/245

(58) Field of Classification Search
CPC ... H01L 27/14623; H04N 5/361; H04N 5/367
USPC ................ 250/208.1; 348/241, 243, 245, 246
See application file for complete search history.

(56) References Cited

U.S. PATENT DOCUMENTS 7,852,386 B2 * 12/2010 Aoki ............................. 348/245

FOREIGN PATENT DOCUMENTS

| JP | 60245166 A | 12/1985 |
| JP | 6310699 A | 11/1994 |
| JP | 200156382 A | 2/2001 |
| JP | 200346075 A | 2/2003 |
| JP | 200526510 A | 1/2005 |
| JP | 2006120922 A | 5/2006 |

(Continued)

OTHER PUBLICATIONS

International Search Report (PCT/ISA/210) dated May 10, 2011, issued by the International Searching Authority in corresponding International Application No. PCT/JP2011/057900.

(Continued)

*Primary Examiner* — Thanh Luu
(74) *Attorney, Agent, or Firm* — Sughrue Mion, PLLC

(57) ABSTRACT

A solid-state image pickup device includes a plurality of effective pixels each including a photoelectric conversion element and an OB pixel that is provided outside of an area where the effective pixels are formed and obtains the same output with a dark output of the effective pixel. Each of the effective pixels includes a first signal read-out circuit formed on a semiconductor substrate. The OB pixel includes a second signal read-out circuit formed on the semiconductor substrate and a capacitor connected to an input node of the second signal read-out circuit. The second signal read-out circuit has the same configuration as the first signal read-out circuit. A capacitance value of the capacitor is a value that renders the capacitance value at the input node of the first signal read-out circuit and the capacitance value at the input node of the second signal read-out circuit to be substantially equal to each other.

13 Claims, 5 Drawing Sheets

(56) References Cited

FOREIGN PATENT DOCUMENTS

| JP | 2006228938 A | 8/2006 |
| JP | 2008235756 A | 10/2008 |
| JP | 200944135 A | 2/2009 |
| JP | 2009164247 A | 7/2009 |
| JP | 2009290089 A | 12/2009 |

OTHER PUBLICATIONS

Written Opinion (PCT/ISA/237) dated May 10, 2011, issued by the International Searching Authority in corresponding International Application No. PCT/JP2011/057900.

* cited by examiner

SOLID-STATE IMAGE PICKUP DEVICE AND IMAGE PICKUP APPARATUS

TECHNICAL FIELD

The present invention relates to a solid-state image pickup device and an image pickup apparatus.

BACKGROUND OF THE INVENTION

A CCD type or CMOS type image sensor (solid-state image pickup device) generally used in the art includes a light receiving unit (an effective pixel area unit) which is constituted by a plurality of photoelectric conversion units that are arranged in a two dimensional array on a surface of a semiconductor substrate. An image signal of an object according to a light shape of the object funned at the light receiving unit is output from each photoelectric conversion unit. An optical black (OB) unit covered with a lightproof film is provided around the light receiving unit, and an offset component of the image signal of the object output from the light receiving unit is removed using a dark signal output from the OB unit as a reference signal.

That is, by subtracting a noise component in a state where light is not incident (which is output of OB unit), so called a dark output, from the image signal of the object (which is output of light receiving unit), a fine image signal of the object can be detected at the light receiving unit with high precision to accomplish a solid-state image pickup device with high S/N ratio. Since the dark output is changed due to a surrounding environment such as temperature, an image signal of the object with high S/N ratio can be obtained in all the environments by providing an OB pixel which is equal to an effective pixel and making the difference of the outputs thereof as the image signal of the object.

In the conventional CCD type or CMOS type solid-state image pickup device as described above, a photoelectric conversion unit (a photodiode) and a signal read-out circuit (an electric charge transmission path and an output amplifier for the CCD type, and a MOS transistor circuit for the CMOS type) which is used to output an image signal of the object detected from the photoelectric conversion unit to the outside should be formed on the same surface of a semiconductor substrate. For this reason, there is a problem in an aperture ratio in which an occupying ratio of the photoelectric conversion unit to a chip area of a solid-state image pickup device cannot become 100%. Such aperture ratio tends to become smaller than before recently according to the refinement of a pixel, and the lowering of the aperture ratio becomes a factor that reduces the S/N ratio.

As a result, a multilayer solid-state image pickup device having a structure in which a photoelectric conversion unit is not provided in a surface of a semiconductor substrate, only a signal read-out circuit is provided on the semiconductor substrate, and the photoelectric conversion layer is stacked at an upper side of the semiconductor substrate has drawn an attention.

For example, a solid-state image pickup device disclosed in Patent Document 1 is configured to detect an X ray or an electronic ray by a photoelectric converting using, for example, an amorphous silicon stacked at an upper side of the semiconductor substrate. In such solid-state image pickup device, an OB pixel is formed by stacking a lightproof layer of 2 μm thickness around an effective pixel area (a light receiving unit) of the outer surfaces of the solid-state image pickup device to shield the photoelectric conversion layer from light and detects a black level of the effective pixel.

A solid-state image pickup device disclosed in Patent Document 2 has a photoelectric conversion layer for detecting red, a photoelectric conversion layer for detecting green, and a photoelectric conversion layer for detecting blue, and captures the color image of an object. In such solid-state image pickup device, a lightproof film is stacked between the surface of a semiconductor substrate and the photoelectric conversion film at the lowest layer and light is not incident to a signal read-out circuit. The configuration of an OB unit is not specifically considered.

In addition, there is a solid-state image pickup device disclosed in Patent Documents 3 and 4 which is a multilayer solid-state image pickup device using a glass substrate or the like rather than a semiconductor substrate.

The solid-state image pickup device disclosed in Patent Document 3 has a configuration in which a photoelectric conversion film is stacked on a substrate formed with a TFT circuit. A pixel for removing noise is provided around an effective pixel, which is used to remove noise on the wirings or signal lines connected to the TFT circuit of the effective pixel. In Patent Document 3, the pixel for removing noise on the wirings or the signal lines is disclosed, but an OB pixel is not considered.

The solid-state image pickup device disclosed in Patent Document 4 has a configuration in which an OB pixel is provided for every effective pixel. The OB pixel includes a dummy capacitor having the same capacitance as the photoelectric conversion element included in the effective pixel and a TFT circuit having the same capacitance as the TFT circuit included in the effective pixel. In Patent Document 4, a configuration in which the dummy capacitor of the OB pixel and the photoelectric conversion element of the effective pixel are formed at the same layer, and a configuration in which the dummy capacitor of the OB pixel is formed below the photoelectric conversion element of the effective pixel, are disclosed as a configuration of the OB pixel and the effective pixel.

PRIOR ART DOCUMENT

Patent Literature

[Patent Document 1]: JP-A-6-310699
[Patent Document 2]: JP-A-2006-228938
[Patent Document 3]: JP-A-2003-46075
[Patent Document 4]: JP-A-2009-44135

SUMMARY OF THE INVENTION

Problems to be Solved

In the solid-state image pickup device disclosed in Patent Document 1, the lightproof film provided in the OB unit is stacked by 2 μm, thus a step of 2 μm is formed between the OB unit and the light receiving unit. Accordingly, when light is incident to this step portion and diffuses, there is a concern that the image of the object is degraded. In addition, since the lightproof film is provided on the photoelectric conversion film, the cost and the number of the processes are increased.

In the solid-state image pickup device disclosed in Patent Documents 2 and 3, a dark output obtained in a state where light is not incident to the photoelectric conversion film, that is, in a lightproof state, cannot be detected, and thus, an image signal of an object with high S/N ratio cannot be obtained.

The solid-state image pickup device disclosed in Patent Document 4 has a configuration in which an OB pixel is provided for every pixel. In this case, stacking of the lightproof film or providing a dummy pixel is needed after patterning the photoelectric conversion film for every pixel. For this reason, the cost and the number of processes are increased. A general solid-state image pickup device has an OB pixel provided around the effective pixel, thus it is needed that an OB pixel suitable for the structure is developed.

The present invention has been made in an effort to provide a multilayer solid-state image pickup device and an image pickup apparatus which can obtain a high quality image signal with a high S/N ratio.

Means for Solving Problem

An exemplary embodiment of the present invention provides a solid-state image pickup device comprising: a plurality of effective pixels each including a photoelectric conversion element; and at least one OB pixel provided outside an area where the effective pixels are formed, the OB pixel being configured to obtain a dark output of the photoelectric conversion element. The photoelectric conversion element includes a pair of electrodes provided at an upper side of a semiconductor substrate, and a light receiving layer provided between the pair of electrodes, the light receiving layer is common to all of the effective pixels. Each of the effective pixels includes a first signal read-out circuit configured to read out a signal according to an electric charge generated at the photoelectric conversion element, the first signal read-out circuit being formed on the semiconductor substrate and configured to include a MOS transistor. The OB pixel includes a second signal read-out circuit formed on the semiconductor substrate to have the same configuration as the first signal read-out circuit, and a capacitor connected to an input node of the first signal read-out circuit. The capacitor is provided closer to the semiconductor substrate side than the photoelectric conversion element. The first signal read-out circuit, the second signal read-out circuit, and the capacitor are shielded from light by a lightproof layer formed closer to the semiconductor substrate side than the photoelectric conversion element. The input node of the first signal read-out circuit is electrically connected to one of the pair of electrodes of the photoelectric conversion element, an input node of the second signal read-out circuit is connected to the capacitor, and the capacitor has a value that renders the capacitance value at the input node of the first signal read-out circuit and the capacitance value at the input node of the second signal read-out circuit to be substantially equal to each other.

According to the configuration as described above, a signal which is the same as an output signal of an effective pixel in the dark can be obtained, and a high quality image signal where an output noise of the effective pixel in the dark is removed cart be obtained. According to the configuration as described above, even though the lightproof layer is not formed at the outer most surface of the area where the OB pixel is formed, the signal that is the same as the output signal of the effective pixel in the dark can be obtained, therefore the degradation of image quality caused by the step between the area where the effective pixel is formed and the area where the OB pixel is formed, is prevented.

The present invention provides a solid-state image pickup device as described above.

Effect of Invention

According to the present invention a multilayer solid-state image pickup device and an image pickup apparatus, which can obtain a high quality image signal with a high S/N ratio, can be provided.

DESCRIPTION OF THE PREFERRED EMBODIMENTS OF THE INVENTION

Figure 1:
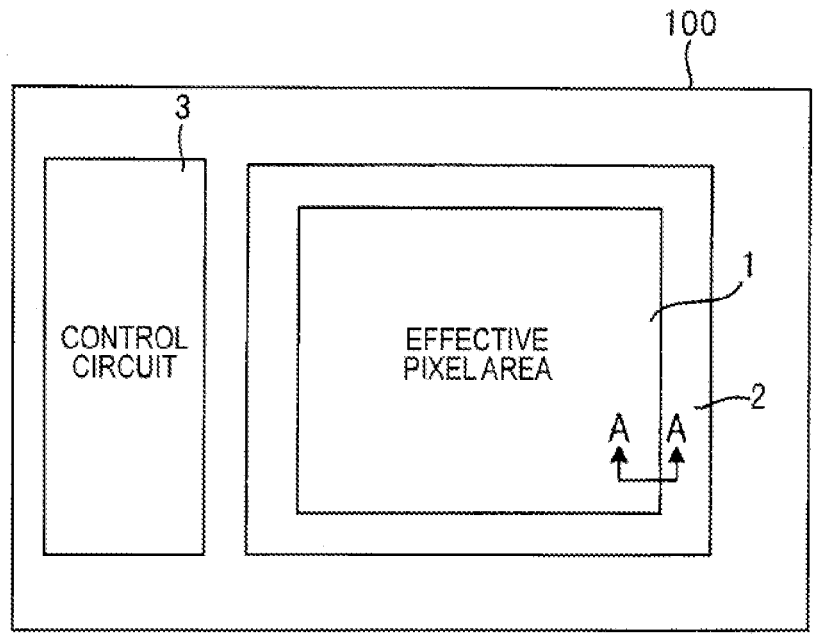
FIG. 1 is a plan view illustrating a schematic configuration of a multilayer solid-state image pickup device of an exemplary embodiment of the present invention.

Hereinafter, the exemplary embodiments of the present invention will be described referring to the drawings.

FIG. 1 is a plan view illustrating a schematic configuration of a multilayer solid-state image pickup device 100 of an exemplary embodiment of the present invention. The solid-state image pickup device 100 is used as an image pickup device of an imaging module which is mounted on an image pickup apparatus such as a digital camera and a digital video camera, an electronic endoscope, a camera attached portable phone or the like.

The multilayer solid-state image pickup device 100 illustrated in FIG. 1 includes an effective pixel area 1, an OB pixel area 2 which is formed around the effective pixel, area 1, and a control circuit 3.

The effective pixel area 1 is an area where the effective pixels for obtaining a signal according to an object light are arranged in a two dimensional direction. An effective pixel, which will be described, later in detail, is constituted by a photoelectric conversion element formed at an upper side of a semiconductor substrate, and a signal read-out circuit provided corresponding to the photoelectric conversion element.

The OB pixel area 2 is an area where at least one OB pixel is provided. The OB pixel is used to obtain a dark signal output from the effective pixel in a state where light is not incident to the effective pixel. The OB pixel, which will be described later in detail, is constituted by a dummy photoelectric conversion element that does not read out a signal, and a signal read-out circuit provided corresponding to the dummy photoelectric conversion element.

The effective pixels of the effective pixel area 1 and the OB pixels of the OB pixel area 2 are arranged in a two dimensional direction (for example, in a square lattice type) as a whole, when viewed from above.

The control circuit 3 performs a driving that reads out a signal from the effective pixel and the OB pixel. The control circuit 3 also performs a processing that corrects a black level by subtracting the signal read out at the OB pixel from the signal read out at the effective pixel.

Figure 2:
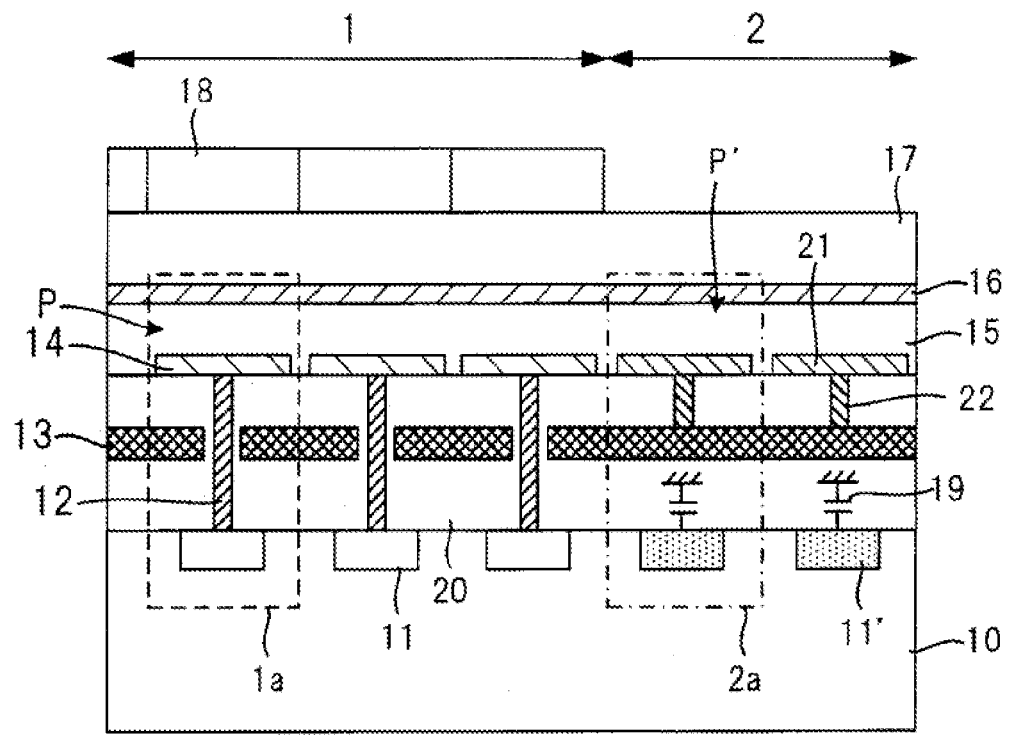
FIG. 2 is a schematic sectional view of the solid-state image pickup device 100 taken on line A-A illustrated in FIG. 1.
Figure 3:
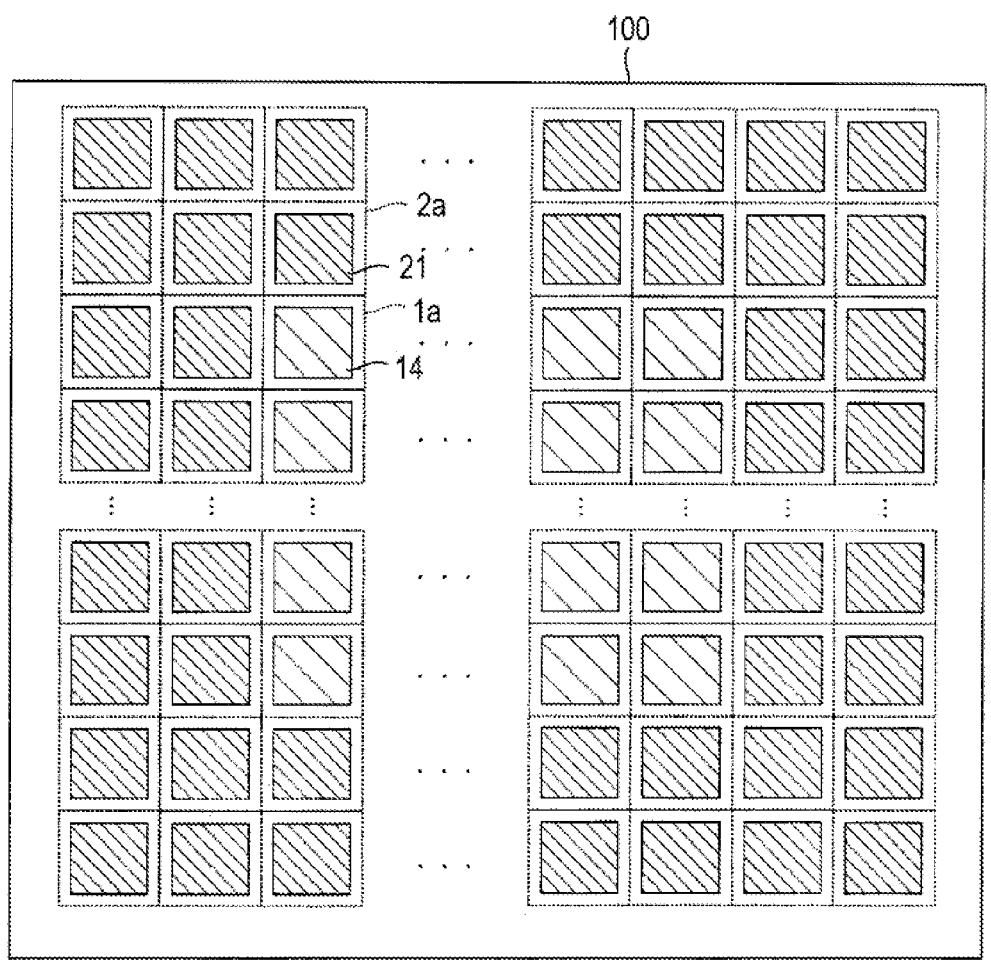
FIG. 3 is a plan view illustrating a schematic arrangement of effective pixels and OB pixels which are included in the solid-state image pickup device 100 illustrated in FIG. 2.

FIG. 2 is a schematic sectional view of the solid-state image pickup device 100 taken on line A-A illustrated in FIG. 1. FIG. 3 is a plan view illustrating a schematic arrangement of effective pixels and OB pixels which are included in the solid-state image pickup device 100 illustrated in FIG. 2.

As illustrated in FIGS. 2 and 3, a plurality of effective pixels 1a (numeral references are provided only to some thereof in FIGS. 2 and 3) are formed in the effective pixel area 1, and a plurality of OB pixels 2a (numeral references are provided only to some thereof in FIGS. 2 and 3) are formed in the OB pixel area 2 around the effective pixel area 10.

As illustrated in FIG. 2, an insulating layer 20 is formed on the semiconductor substrate where the effective pixel area 1 and the OB pixel area 2 are combined. On the insulating layer 20 formed by combining the effective pixel area 1 and the OB pixel area 2, pixel electrodes 14 and pixel electrodes 21 are formed and arranged in a two dimensional direction with a predetermined pitch when viewed from above as illustrated in FIG. 3. The pixel electrodes 14 are arranged in the effective pixel area 1, and the pixel electrodes 21 are arranged in the OB pixel area 2.

The pixel electrodes 14, 21 are formed on the insulating layer 20 by forming a film of an electrode material and patterning the same, and the pixel electrodes 14, 21 are formed at the same layer.

A light receiving layer 15 is formed on the pixel electrodes 14, 21 covering the pixel electrodes 14, 21. The light receiving layer 15 is common to all of the pixels.

An opposing electrode 16 is formed on the light receiving layer 15, and a protective layer 17 is provided on the opposing electrode 16.

The color filters 18 are formed at a corresponding position to each pixel electrode 14 formed in the effective pixel area 1, on the protective layer 17 of the effective pixel area 1. The color filters 18 are primary color filters in Bayer array.

A photoelectric conversion element P of the effective pixel 1a is formed by the pixel electrode 14 provided on the effective pixel area 1, the opposing electrode 16 at an upper side of the pixel electrode 14, and the light receiving layer 15 between the pixel electrode 14 and the opposing electrode 16.

A dummy photoelectric conversion element P' of the OB pixel 2a is formed by the pixel electrode 21 provided at the OB pixel area 2, the opposing electrode 16 at an upper side of the pixel electrode 21, and the light receiving layer 15 between the pixel, electrode 21 and the opposing electrode 16.

The light receiving layer 15 includes at least a photoelectric conversion layer constituted by including organic or inorganic photoelectric conversion material that generates an electric charge according to the received light. Since the solid-state image pickup device 100 performs the spectrum by the color filters 18, the corresponding photoelectric conversion layer uses a photoelectric conversion material that senses the light in the visible range.

The opposing electrode 16 is used to apply a bias voltage between the opposing electrode 16 and the pixel electrodes 14, 21, and the voltage is supplied from a power source (not shown). The electric charges generated at the light receiving layer 15 of the photoelectric conversion elements P and P' can be moved to the pixel electrodes 14, 21 by applying the bias voltage between the opposing electrode 16 and the pixel electrodes 14, 21.

The opposing electrode 16 is made out of a transparent material against the incident light such that the light is incident to the light receiving layer 15. Transparent conducting oxide (TCO) may be used as the opposing electrode 16, which has a lower resistive value and a high transmissivity for the visible light.

The pixel electrodes 14, 21 are used to collect the electric charges generated at the light receiving layer 15 of the photoelectric conversion elements P, P' including the pixel electrodes 14, 21. The pixel electrodes 14, 21 are made out of a transparent or non-transparent conducting material. TCO or a metal such as Cr, In, Al, Ag, W and titan nitride (TiN) is used as the material for the pixel electrodes 14, 21.

An electric charge blocking layer may be provided between the photoelectric conversion layer and the pixel electrodes 14, 21 in the light receiving layer 15, which prevents the electric charge from being entered to the photoelectric conversion layer from the pixel electrodes 14, 21. Similarly, an electric charge blocking layer may be provided between the opposing electrode 16 and the photoelectric conversion layer, which prevents the electric charge from being entered to the photoelectric conversion layer from the opposing electrode 16. In addition, other functional layer rather than the electric charge blocking layer may be provided in the light receiving layer 15.

A signal read-out circuit 11 is formed on the semiconductor substrate 10 of the effective pixel area 1, which is provided corresponding to each photoelectric conversion element P. The effective pixel 1a is constituted by the photoelectric conversion element P and the signal read-out circuit 11.

The signal read-out circuit 11 of the effective pixel 1a is electrically connected to the pixel electrode 14 of the corresponding effective pixel 1a through a conductive plug 12 formed within the insulating layer 20. That is, the signal read-out circuit 11 of the effective pixel 1a is electrically connected to the light receiving layer 15 of the photoelectric conversion element P of the effective pixel 1a.

A signal read-out circuit 11' is formed on the semiconductor substrate 10 of the OB pixel area 2, which is provided corresponding to each photoelectric conversion element P'.

The configuration of the signal read-out circuit 11' is the same as that of the signal read-out circuit 11. However, an input node of the signal read-out circuit 11' is not electrically connected to the photoelectric conversion elements P, P' but is connected to a capacitor 19. As an example of FIG. 2, the capacitor 19 is formed within the insulating layer 20 which is closer to the semiconductor substrate 10 side than the photoelectric conversion element P. Then, the input node of the signal read-out circuit 11' is electrically connected to one end of the capacitor 19.

The OB pixel 2a is constituted by the photoelectric conversion element P', the signal read-out circuit 11' corresponding to the photoelectric conversion element P', and the capacitor 19 connected to the signal read-out circuit 11'. As the example in FIG. 2, the capacitor 19 included in the OB pixel 2a is formed within the insulating layer 20 between the semiconductor substrate 10 and the lightproof layer 13.

The lightproof layer 13 is formed within the insulating layer 20 at an upper side of the semiconductor substrate 10 and a lower side of the photoelectric conversion elements P, P', shielding the signal read-out circuit 11, the signal read-out circuit 11', and the capacitor 19 from the light. The lightproof layer 13 is formed by the non-transparent material made out of, for example, a metal (tungsten, aluminum, copper or the like). Further, the lightproof layer 13 is connected to a power source terminal (not shown) connected to a fixed power source (e.g., ground).

The pixel electrode 21 of the OB pixel 2a is electrically connected to the lightproof layer 13 which is connected to a fixed power source through a conductive plug 22 formed within the insulating layer 20. For this reason, the electric charge, generated at the light receiving layer 15 of the photoelectric conversion element P' and collected at the pixel electrode 21, is discharged to the fixed power source from the lightproof layer 13.

In the solid-state image pickup device illustrated in FIG. 2, no lightproof film is formed at an upper side of the opposing electrode 16 provided in the OB pixel area 2. For this reason, in the effective pixel area 1 and the OB pixel area 2, no step is formed in a lower layer than the color filters 18.

Figure 4:
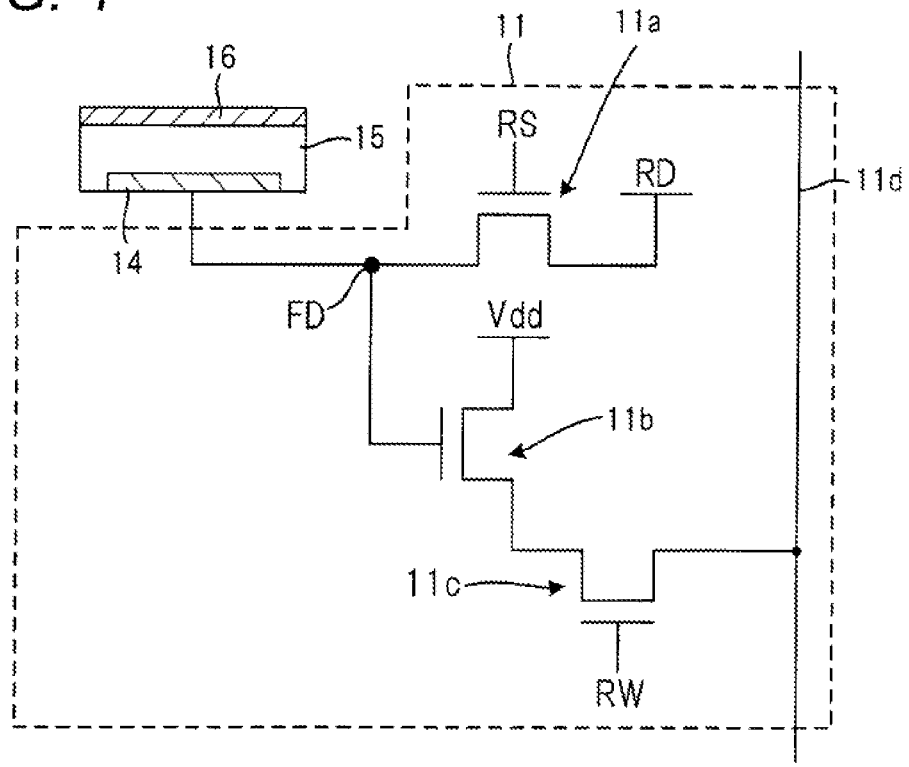
FIG. 4 is a view illustrating, an example of a circuit configuration of a signal read-out circuit 11 illustrated in FIG. 2.

FIG. 4 illustrates an example of a circuit configuration of the signal read-out circuit 11 illustrated in FIG. 2.

The signal read-out circuit 11, has a floating diffusion (FD) which is an input node, and a known three transistor configuration including a reset transistor 11a, an output transistor 11b, and a row selecting transistor 11c.

The floating diffusion (FD) is electrically connected to the pixel electrode 14 through the conductive plug 12, the electric potential of the floating diffusion is changed according to the electric potential of the pixel electrode 14.

The reset transistor 11a is a MOS transistor that resets the electric potential of the floating diffusion (FD). The reset transistor 11a is controlled by the control circuit 3.

The output transistor 11b is a MOS transistor that outputs the electric potential of the floating diffusion (FD).

The row selecting transistor 11c is a MOS transistor that outputs a signal converted at the output transistor 11b to an output signal line 11d when a row selecting pulse RW is supplied to a gate electrode from the control circuit 3.

Figure 5:
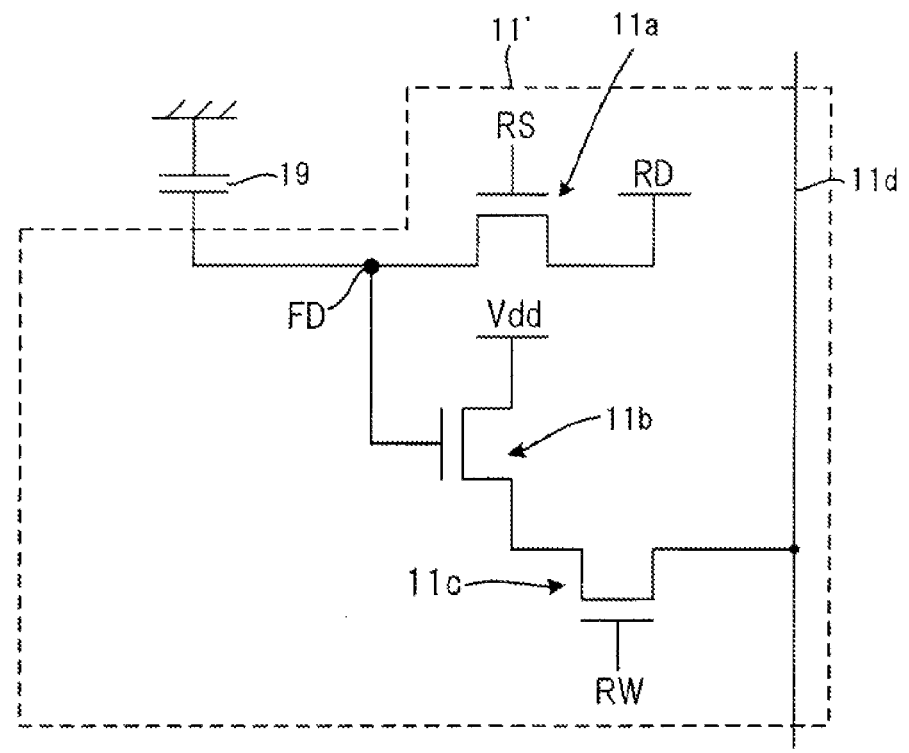
FIG. 5 is a view illustrating an example of a circuit configuration of a signal read-out circuit 11' illustrated in FIG. 2.

FIG. 5 illustrates an example of a configuration of the signal read-out circuit 11' illustrated in FIG. 2. The signal read-out circuit 11' has the same configuration as the signal read-out circuit 11 illustrated in FIG. 4, except that a floating diffusion FD which is an input node, is electrically connected to one end of the capacitor 19 rather than the pixel electrode 14.

The capacitance of the capacitor 19 has a value such that the capacitance value, at the input node of the signal read-out circuit 11 (total capacitance including the capacitance of the photoelectric conversion element P, the capacitance of the signal read-out circuit 11 itself, and other parasitic capacitance) is substantially equal to the capacitance value at the input node of the signal read-out circuit 11' (total capacitance including the capacitance of the capacitor 19, the capacitance of the signal read-out circuit 11' itself, and other parasitic capacitance).

The signal read-out circuit 11' is constituted by components formed within the semiconductor substrate (for example, a floating diffusion (FD), a source and a drain of a transistor, or the like) and components formed on the semiconductor substrate via a gate insulation film (not shown) (for example, a gate electrode of a transistor, or the like).

The insulating layer 20 is a layer formed at an upper side of the gate electrode, and a wiring such as a signal output line, a power source line or the like is formed within the insulating layer 20. And, the capacitor 19 is formed within the insulating layer 20 at an upper side of the semiconductor substrate 10.

Since the capacitor 19 is formed at an upper side of the semiconductor substrate 10, the characteristics of the signal read-out circuit 11 and the signal read-out circuit 11' can be simply matched to each other. As a result, the design of the capacitor 19 becomes easy, and the cost is reduced.

When the dark current generated at the light receiving layer 15 is small enough to be neglected, the signal read out to the output signal line lid from the signal read-out circuit 11' is equal to the signal output in the dark (dark output signal) at the photoelectric conversion element P that is connected to the signal read-out circuit 11. That is, the OB pixel 2a can read out a signal equal to the dark output signal of the effective pixel 1a.

Since the effective pixel la and the OB pixel 2a are equal to each other in a circuit, it is difficult to detect the change of the dark current generated at the photoelectric conversion element P by the OB pixel 2a. For this reason, it is preferable to use one in which the change of the dark current by a temperature is small enough to be neglected (environmental dependency is small enough to be neglected) as the light receiving layer 15.

In order to make the environmental dependency of the light receiving layer 15 to be small enough to be neglected, the light receiving layer 15 may include organic material. Specifically, it is preferable that the light receiving layer 15 is constituted by a plurality of layers of the photoelectric conversion layer including organic material and the electric charge blocking layer including organic material, because the effect of reducing the dark current is high.

In addition, the explanation that the capacitance value at the input node of the signal read-out circuit 11 is equal to the capacitance value at the input node of the signal read-out circuit 11' indicates that the difference of the capacitance values at the input node of the signal read-out circuit 11 and the input node of the signal read-out circuit 11' is not more than 10% at a room temperature (25° C.). It is preferable that the difference is not more than 3%, and more preferable that the difference is not more than 1%.

Although it is preferable that these two capacitance values are exactly matched to each other, it is difficult to match the two capacitance values because of a variation caused by the manufacturing processes, a variation of the capacitance by the temperature, or the like. Within the above-described error range, the dark output can be precisely removed.

For example, when the error is not more than 10%, the major noise can be removed which drastically degrades the image quality. In addition, when the error is not more than 3%, almost all noises can be removed. In addition, when the error is not more than 1%, the noise can be completely removed.

The capacitance values of the capacitor 19, the signal read-out circuit 11, and the signal read-out circuit 11' can be designed and calculated as in a general semiconductor. In addition, the capacitance value of the photoelectric conversion element P can be calculated from the permittivity and the thickness of the light receiving layer 15 and the size of the pixel electrode 14, as in a general dielectric substance. In addition, the capacitance values at the input nodes of the signal read-out circuits 11 can be measured by a light shot noise method.

It is preferable that the capacitor 19 to be used has a small environment dependency. For example, it is preferable to use a MM (metal-metal) type capacitor having an insulating layer interposed between metals, and a PIP (poly-poly) type capacitor having an insulating layer interposed between polysilicon. The reason is that there is a possibility that a signal same as the dark output of the effective pixel 1a cannot be always read out at the OB pixel 2a, when the environment dependency is large.

Now, the operations of the solid-state image pickup device 100 will be described, which is configured as described above.

When the exposure of the solid-state image pickup device 100 is initiated in a state where a predetermined voltage is applied to the opposing electrode 16, light is incident to the light receiving layer 15 and then an electric charge is generated therefrom. In each photoelectric conversion element P, the electric charge generated from the light receiving layer 15 is collected to the pixel electrode 14 by the bias voltage. In the OB area 2, the electric charge generated from the light receiving layer 15 is collected to the pixel electrode 21, but the electric charge is discharged to the fixed power source through the lightproof layer 13.

When the exposure is completed, the reading is initiated at the effective pixel 1a and the OB pixel 2a. For the effective pixel 1a, the control circuit 3 turns ON the row selecting transistors 11c of the signal read-out circuit 11 one by one, thus the signal according to the electric potential of the floating diffusion (FD) of the signal read-out circuit 11 is output to the output signal line 11d. The signal output to the output signal line 11d (hereinafter, refers to "effective signal") is stored in a memory of an image pickup apparatus equipped with the solid-state image pickup device 100.

For the OB pixel 2a, the control circuit 3 turns ON the row selecting transistors 11c of the signal read-out circuit 11' one by one, thus the signal according to the electric potential of the floating diffusion (FD) of the signal read-out circuit 11' (hereinafter, refers to "OB signal") is output to the output signal line 11d. The OB signal output to the output signal line 11d is stored in the memory of the image pickup apparatus equipped with the solid-state image pickup device 100.

In the image pickup apparatus, the subject image signal excluding the effect of the dark output is obtained by performing a black level correcting that subtracts the OB signal from the each effective signal stored in the memory.

As described above, according to the solid-state image pickup device 100, the OB signal same as the dark output signal under a condition where the photoelectric conversion element P is shielded from light, can be read out by the signal read-out circuit 11' of the OB pixel 2a, and the image signal of an object with high S/N ratio can be obtained.

Further, according to the solid-state image pickup device 100, the OB signal can be obtained without providing the lightproof film at an upper side than the opposing electrode 16 that exists in the OB pixel area 2. For this reason, a step caused by the lightproof film is not formed between the effective pixel area 1 and the OB pixel area 2, and there is no concern that the image of an object is degraded by the diffused reflection of the light. Further, since the lightproof film is not formed at an upper side of the opposing electrode 16, the cost for the forming process of the lightproof film can be removed.

Since the lightproof layer that shields the signal read-out circuit from the light is needed in the conventional multilayer image pickup device as well, the solid-state image pickup device 100 can shield the signal read-out circuit 11' and the capacitor 19 using such lightproof layer and can prevent the manufacturing processes from being increased.

Further, in the solid-state image pickup device 100, the dummy photoelectric conversion element P' is formed in the OB pixel area 2. When the dummy photoelectric conversion element P' is not formed, the patterning of the light receiving layer 15 in the OB pixel area 2 is needed, thus the manufacturing process becomes complicated. Therefore, the manufacturing of the solid-state image pickup device 100 will be easily performed by forming the dummy photoelectric conversion element P' in the OB pixel area 2 as well.

Further, since the dummy photoelectric conversion element P' is not used to perform the signal reading and the imaging (that is, not electrically connected to the signal read-out circuits 11, 11'), the pixel electrode 21 may be omitted. Since the pixel electrode 21 and the pixel electrode 14 are formed simultaneously, the existence of the pixel electrode 21 does not affect the manufacturing process.

However, when the pixel electrode 21 of the dummy photoelectric conversion element P' is omitted, the electric charge generated from the light receiving layer 15 in the OB pixel area 2 may move to the outmost pixel electrode 14 among the plurality of pixel electrodes 14 arranged in the effective pixel area 1.

When such moving occurs, only the signal from the outmost effective pixel 1a among the plurality of effective pixels 1a has a high level, thus there is concern that the image quality may be degraded. Accordingly, when the pixel electrode 21 of the dummy photoelectric conversion element P' is omitted, the image degradation can be prevented by a processing that does not use the signal read out from the outmost effective pixel 1a.

As illustrated in FIGS. 2 and 3, when the pixel electrode 21 is provided in the dummy photoelectric conversion element P', the electric charge generated from the light receiving layer 15 in the OB pixel area 2 does not move to the outmost pixel electrode 14 among the plurality of pixel electrodes 14 arranged in the effective pixel area 1.

For this reason, the image data can be created without performing the processing where the signal read out from the outmost effective pixel 1a is not used. Further, in a case of the configuration illustrated in FIGS. 2 and 3, the pixel electrodes 14 and 21 are made out of a lightproof material, the lightproof property of the capacitor 19 and the signal read-out circuits 11 and 11' may be increased.

Even though the color filters 18 are not formed in the OB pixel area 2 in the example of FIG. 2, the color filters 18 may be formed in the OB pixel area 2. In this case, the amount of light incident to the lightproof layer 13 of the OB pixel area 2 may be reduced, and the reflection of light unnecessary in the insulating layer 20 may be reduced.

Next, a modified example of the solid-state image pickup device 100 illustrated in FIG. 1 will be described.

First Modified Example

Figure 6:
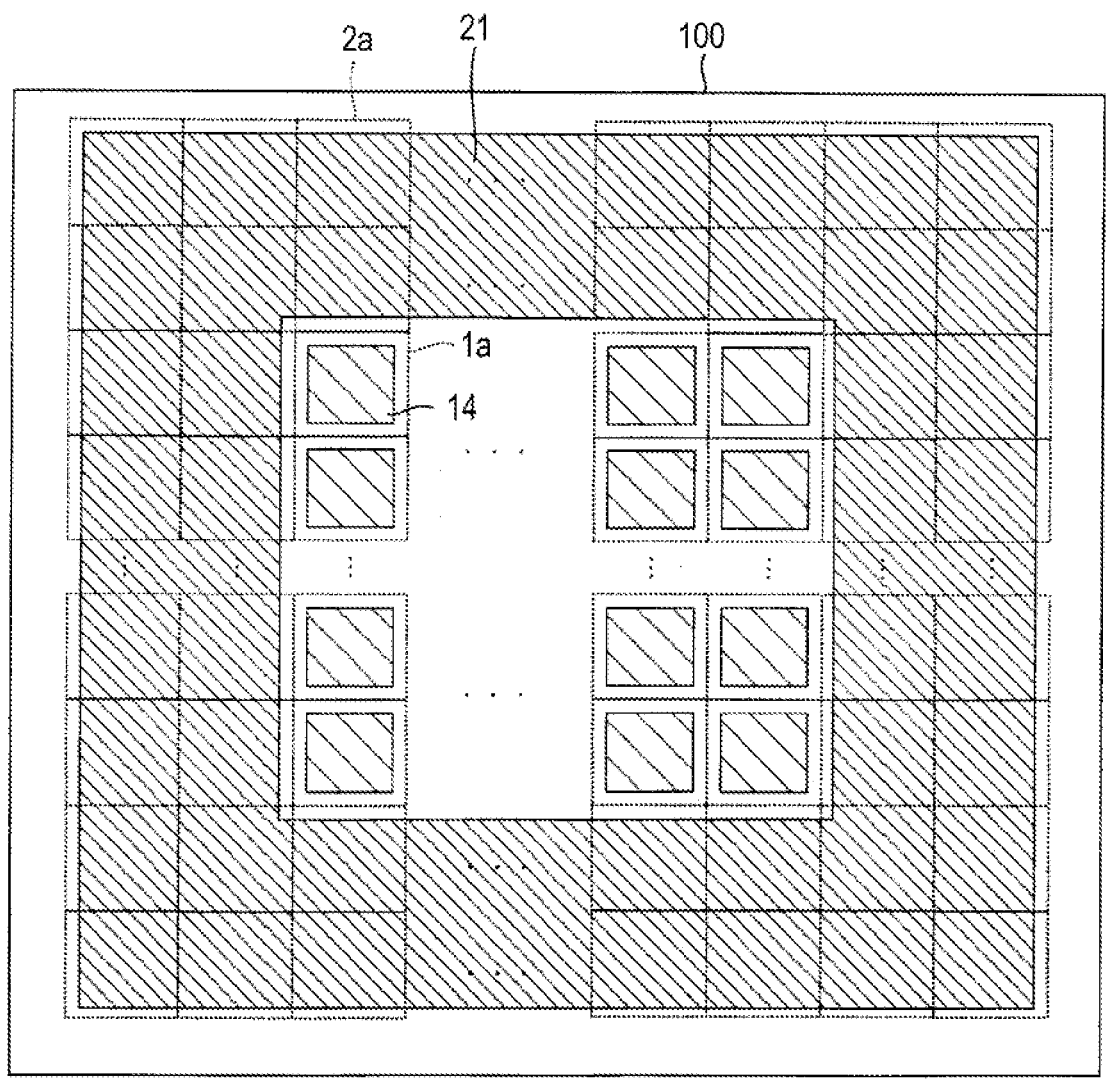
FIG. 6 is a view illustrating a modified example of the solid-state image pickup device illustrated in FIG. 1, which corresponds to FIG. 3.

FIG. 6 illustrates a modified example of the solid-state image pickup device illustrated in FIG. 1, and corresponds to FIG. 3. The solid-state image pickup device illustrated in FIG. 6 is the same as the configuration illustrated in FIG. 3 except that the pixel electrode 21 of the OB pixel area 2 is integrally formed over the entire OB pixels rather than separated for every OB pixel 2a.

Since the dummy photoelectric conversion element P' of the OB pixel 2a does not need to read out the signal, the pixel electrode 21 may not be separated for every OB pixel 2a. For this reason, even though the pixel electrode 21 of the OB pixel 2a is integrally formed over the entire OB pixel area 2 as illustrated in FIG. 6, there occurs no problem.

Since the area of the pixel electrode 21 arranged on the OB pixel area 2 increases by such configuration, the possibility that the electric charge generated from the light receiving layer 15 of the OB pixel area 2 may move to the pixel electrode 14 of the effective pixel area 1 is further reduced than the case of FIG. 3, which is preferable.

Second Modified Example

Figure 7:
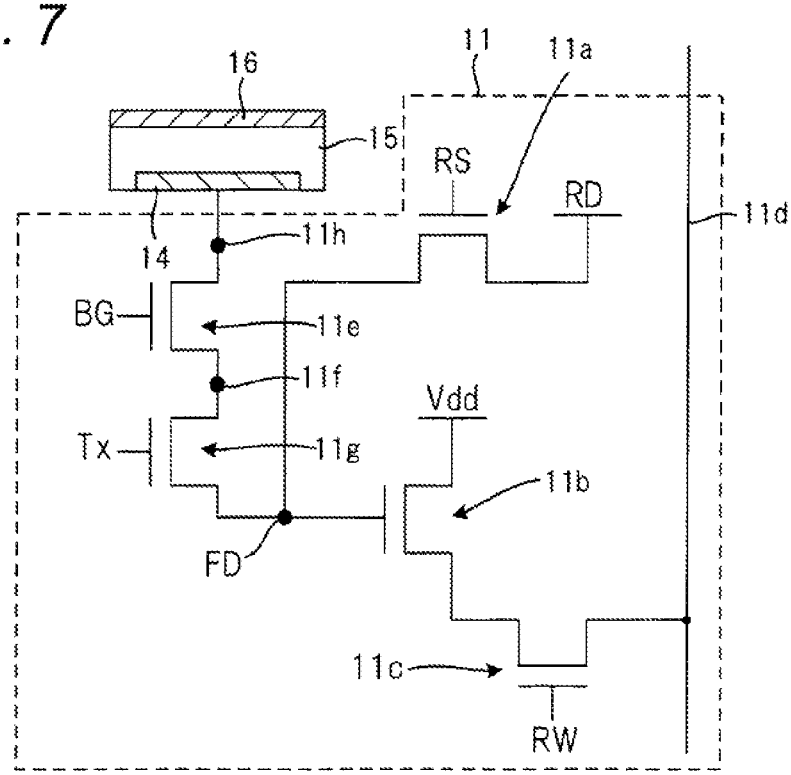
FIG. 7 is a view illustrating a modified example of the signal read-out circuit 11 in the solid-state image pickup device illustrated in FIG. 1.

FIG. 7 illustrates a modified example of the signal read-out circuit 11 in the solid-state image pickup device illustrated in FIG. 1.

The signal read-out circuit 11 illustrated in FIG. 7 is the same as the configuration of the circuit illustrated in FIG. 4, except that a transistor 11e, an electric charge accumulation part 11f a transistor 11g, and a connecting part 11h which is an input node, are added thereto.

The electric charge accumulation part 11f is an impurity layer formed in the semiconductor substrate 10, and accumulates the electric charge collected to the pixel electrode 14 of the photoelectric conversion element P.

The transistor 11e is an impurity layer formed spaced apart a little from the electric charge accumulation part 11f in the semiconductor substrate 10, and includes the connecting part 11h that is electrically connected to the pixel electrode 14 through the conductive plug 12, and a gate electrode provided at an upper side of the semiconductor substrate between the connecting part 11h and the electric charge accumulation part 11f.

An electric potential barrier part formed by an impurity layer that forms an electric potential barrier is provided below the gate electrode of the transistor 11e. The electric charge collected to the pixel electrode 14 during the exposure process reaches the connecting part 11h through the conductive plug 12, and then is accumulated to the electric charge accumulation part 11f through the electric potential barrier part.

The transistor 11g includes the electric charge accumulation part 11f, the floating diffusion (FD), and the gate electrode at an upper side of the semiconductor substrate 10 between the electric charge accumulation part 11f and the floating diffusion. The electric charge accumulated in the electric charge accumulation part 11f is transmitted to the floating diffusion (FD) by controlling the voltage of the gate electrode.

As described above, the signal read-out circuit 11 may be configured to accumulate the electric charge generated from the photoelectric conversion element P to the electric charge accumulation part 11f and then, convert the electric charge into a signal. In addition, such a circuit configuration is described in Japanese Patent Laid-Open No. 2010-16417 in detail.

Figure 8:
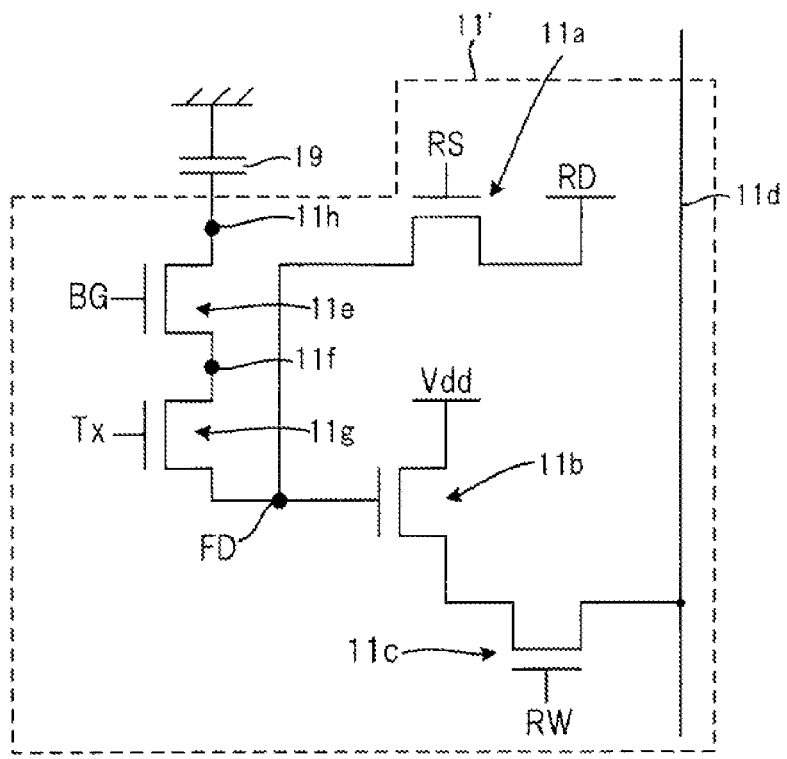
FIG. 8 is a view illustrating a modified example of the signal read-out circuit 11' in the solid-state image pickup device illustrated in FIG. 1.

FIG. 8 illustrates a modified example of a signal read-out circuit 11' in the solid-state image pickup device illustrated in FIG. 1. The signal read-out circuit 11' illustrated in FIG. 8 is the same as the configuration of the circuit illustrated in FIG. 7, except that the capacitor 19 is connected to the connecting part 11h of the transistor 11e.

As described above, by making the configurations of the signal read-out circuit 11 and the signal read-out circuit 11' to be equal to each other and making the capacitance values of each input node (connecting part 11h) to be substantially equal, a signal may be obtained from the signal read-out circuit 11' as in the signal obtained in the dark from the photoelectric conversion element P.

In the foregoing description, an example is described where one photoelectric conversion layer 15 is stacked at an upper side of the semiconductor substrate 10 to perform a spectrum with the color filters 18. However, the present invention is not limited thereto. A configuration may be used in which three types of photoelectric conversion layers are stacked without color filters, as disclosed in, for example, Patent Document 2. In this case, three types of signal read-out circuits are necessary against one effective pixel, thus three types of signal read-out circuits are provided and then each of the circuits may be connected to the capacitor.

Even though the capacitor 19 is formed below the lightproof layer 13 as illustrated in FIG. 2, the capacitor 19 may be formed within the insulating layer 20 above the lightproof layer 13. In this case, a light blocking layer that shields the capacitor 19 from light may be separately formed within the insulating layer 20. In this case, since the OB signal can be obtained without forming the lightproof film at an upper side of the opposing electrode 16, image quality can be improved.

As described above, followings are disclosed in the present specification.

The solid-state image pickup device as described above includes a plurality of effective pixels each including a photoelectric conversion element, and one or more OB pixels provided outside of an area where the effective pixels are formed, the OB pixel being configured to obtain the same output with a dark output of the effective pixel. The photoelectric conversion element includes a pair of electrodes provided at an upper side of a semiconductor substrate, and a light receiving layer provided between the pair of electrodes, the light receiving layer is common to all of the effective pixels. Each of the effective pixels includes a first signal read-out circuit configured to read out a signal according to an electric charge generated at the photoelectric conversion element. The first signal read-out circuit is formed on the semiconductor substrate and configured to include a MOS transistor. The OB pixel includes a second signal read-out circuit formed on the semiconductor substrate to have the same configuration as the first signal read-out circuit, and a capacitor connected to an input node of the second signal read-out circuit. The capacitor is provided closer to the semiconductor substrate side than the photoelectric conversion element. The first signal read-out circuit, the second signal read-out circuit, and the capacitor are blocked from light by a lightproof layer formed closer to the semiconductor substrate side than the photoelectric conversion element. The input node of the first signal read-out circuit is electrically connected to one of the pair of electrodes of the photoelectric conversion element, an input node of the second signal read-out circuit is connected to the capacitor, and the capacitance of the capacitor has a value that renders the capacitance value at the input node of the first signal read-out circuit and the capacitance value at the input node of the second signal read-out circuit to be substantially equal to each other.

In the disclosed solid-state image pickup device, the light receiving layer includes a photoelectric conversion layer including an organic material.

In the disclosed solid-state image pickup device, the light receiving layer includes an electric charge blocking layer including an organic material.

In the disclosed solid-state image pickup device, the capacitor is formed at an upper side of the semiconductor substrate.

In the solid-state image pickup device, an electrode of the capacitor is formed of a metal or polysilicon.

In the solid-state image pickup device as described above, the OB pixel includes a dummy photoelectric conversion element provided at an upper side of the semiconductor substrate, the dummy photoelectric conversion element being configured to be electrically non-connected to the second signal read-out circuit. The dummy photoelectric conversion element includes at least an electrode formed on the same layer as the other electrode of the pair of electrodes of the photoelectric conversion element, and the light receiving layer.

In the solid-state image pickup device, the electrode of the dummy photoelectric conversion element, which is formed on the same layer as the other electrode of the pair of electrodes, is not formed with a lightproof film on the top side thereof.

The solid-state image pickup device further includes an electric charge discharging unit configured to discharge the electric charge generated from the light receiving layer of the dummy photoelectric conversion element.

In the solid-state image pickup device, the dummy photoelectric conversion element includes the electrode formed on the same layer as the other electrode, the light receiving layer, and a dummy electrode formed on the same layer as the one of the pair of electrodes. A power source terminal is connected to the lightproof layer, the dummy electrode is electrically connected to the lightproof layer, and the electric charge discharging unit is constituted by the dummy electrode, the lightproof layer, and the power source terminal.

In the solid-state image pickup device, two or more OB pixels are provided, and the dummy electrode is integrally formed over the entire OB pixels.

In the solid-state image pickup device, the first signal read-out circuit includes: an electric charge accumulation part formed in the semiconductor substrate and configured to accumulate the electric charge collected at the one electrode; a floating diffusion to which the electric charge accumulated in the electric charge accumulation part is transferred; and a transistor circuit configured to output a signal according to the electric potential of the floating diffusion.

In the solid-state image pickup device, the first signal read-out circuit includes a floating diffusion connected to the one electrode, and a transistor circuit configured to output a signal according to the electric potential of the floating diffusion.

The disclosed image pickup apparatus includes a solid-state image pickup device as described above.

INDUSTRIAL APPLICABILITY

According to the present invention, a multilayer solid-state image pickup device and an image pickup apparatus, which can obtain a high quality image signal with a high S/N ratio, can be provided.

Although the present invention has been described with reference to detailed and specific embodiments thereof, it is obvious to those skilled in the art that various changes or modifications may be made without departing from the sprit and scope of the present invention.

The present application is based on Japanese Patent Application No. 2010-084408 filed on Mar. 31, 2010 and Japanese Patent Application No. 2010-244819 filed on Oct. 29, 2010, the contents of which are herein incorporated by reference.

EXPLANATION OF REFERENCE NUMERALS AND SYMBOLS

1: Effective pixel area
2: OB pixel area
1a: Effective pixel
2a: OB pixel
10: Semiconductor substrate
11, 11': Signal read-out circuit
13: Lightproof layer
14: Pixel electrode
15: Photoelectric conversion layer
16: Opposing electrode
19: Capacitor
20: Insulating layer
21: Dummy pixel electrode
P: Photoelectric conversion element
P': Dummy photoelectric conversion element

The invention claimed is:

1. A solid-state image pickup device comprising:
a plurality of effective pixels each including a photoelectric conversion element; and
an OB pixel that is provided outside of an area where the effective pixels are formed, and obtains the same output with a dark output of the effective pixel,
wherein the photoelectric conversion element includes a pair of electrodes provided at an upper side of a semiconductor substrate, and a light receiving layer provided between the pair of electrodes,
the light receiving layer is common to all of the effective pixels,
each of the effective pixels includes a first signal read-out circuit to read a signal according to an electric charge generated at the photoelectric conversion element, the first signal read-out circuit being formed on the semiconductor substrate and includes a MOS transistor,
the OB pixel includes a second signal read-out circuit formed on the semiconductor substrate, and a capacitor connected to an input node of the second signal read-out circuit, the second signal read-out circuit has the same configuration as the first signal read-out circuit,
the capacitor is provided closer to the semiconductor substrate side than the photoelectric conversion element,
the first signal read-out circuit, the second signal read-out circuit, and the capacitor are blocked from light by a lightproof layer formed closer to the semiconductor substrate side than the photoelectric conversion element,
the input node of the first signal read-out circuit is electrically connected to one of the pair of electrodes of the photoelectric conversion element, and
a capacitance value of the capacitor is a value that renders the capacitance value at the input node of the first signal read-out circuit and the capacitance value at the input node of the second signal read-out circuit to be substantially equal to each other.

2. The solid-state image pickup device of claim 1, wherein the light receiving layer includes a photoelectric conversion layer including an organic material.

3. The solid-state image pickup device of claim 2, wherein the light receiving layer includes an electric charge blocking layer including an organic material.

4. The solid-state image pickup device of claim 1, wherein the capacitor is formed at an upper side of the semiconductor substrate.

5. The solid-state image pickup device of claim 4, wherein an electrode of the capacitor is formed of a metal or polysilicon.

6. The solid-state image pickup device of claim 1, wherein the OB pixel includes a dummy photoelectric conversion element provided at an upper side of the semiconductor substrate, the dummy photoelectric conversion element being electrically non-connected to the second signal read-out circuit, and
the dummy photoelectric conversion element includes at least an electrode formed on the same layer as the other electrode of the pair of electrodes of the photoelectric conversion element, and a dummy light receiving layer.

7. The solid-state image pickup device of claim 6, wherein the electrode of the dummy photoelectric conversion element, which is formed on the same layer as the other electrode of the pair of electrodes, is not formed with a lightproof film on the top side thereof.

8. The solid-state image pickup device of claim 6, further comprising an electric charge discharging unit that discharges the electric charge generated from the dummy light receiving layer.

9. The solid-state image pickup device of claim 8, wherein the dummy photoelectric conversion element includes the electrode formed on the same layer as the other electrode, the dummy light receiving layer, and a dummy electrode formed on the same layer as the one of the pair of electrodes, a power source terminal is connected to the lightproof layer, the dummy electrode is electrically connected to the lightproof layer, and the electric charge discharging unit includes the dummy electrode, the lightproof layer, and the power source terminal.

10. The solid-state image pickup device of claim 9, wherein two or more OB pixels are provided, and the dummy electrode is integrally formed over the entire OB pixels.

11. The solid-state image pickup device of claim 1, wherein the first signal read-out circuit includes:

an electric charge accumulation part that is formed in the semiconductor substrate and accumulates the electric charge collected at the one electrode;

a floating diffusion to which the electric charge accumulated in the electric charge accumulation part is transmitted; and a transistor circuit that outputs a signal according to the electric potential of the floating diffusion.

12. The solid-state image pickup device of claim 1, wherein the first signal read-out circuit includes:

a floating diffusion that is connected to the one electrode; and a transistor circuit that outputs a signal according to the electric potential of the floating diffusion.

13. An image pickup apparatus comprising a solid-state image pickup device according to claim 1.

\* \* \* \* \*